US010892031B2

United States Patent
Yuan

(10) Patent No.: US 10,892,031 B2
(45) Date of Patent: Jan. 12, 2021

(54) DATA STORAGE DEVICE AND CONTROL METHOD FOR NON-VOLATILE MEMORY

(71) Applicant: Silicon Motion, Inc., Jhubei (TW)

(72) Inventor: Yi-Hung Yuan, New Taipei (TW)

(73) Assignee: SILICON MOTION, INC., Jhubei (TW)

( * ) Notice: Subject to any disclaimer, the term of this patent is extended or adjusted under 35 U.S.C. 154(b) by 0 days.

(21) Appl. No.: 16/524,114

(22) Filed: Jul. 28, 2019

(65) Prior Publication Data
US 2020/0098442 A1     Mar. 26, 2020

Related U.S. Application Data

(60) Provisional application No. 62/736,517, filed on Sep. 26, 2018.

(30) Foreign Application Priority Data

Apr. 11, 2019   (TW) .............................. 108112761 A

(51) Int. Cl.
| | | |
|---|---|---|
| G11C 29/52 | (2006.01) | |
| G11C 29/00 | (2006.01) | |
| G06F 11/07 | (2006.01) | |
| G11C 29/42 | (2006.01) | |
| G06F 11/10 | (2006.01) | |
| G11C 29/24 | (2006.01) | |

(52) U.S. Cl.
CPC .......... *G11C 29/76* (2013.01); *G06F 11/0772* (2013.01); *G06F 11/1016* (2013.01); *G11C 29/24* (2013.01); *G11C 29/42* (2013.01); *G11C 29/52* (2013.01)

(58) Field of Classification Search
CPC ..... G11C 29/76; G11C 29/1016; G11C 29/24; G11C 29/42; G11C 29/52; G06F 11/0772
USPC ..................................................... 365/189.05
See application file for complete search history.

(56) References Cited

U.S. PATENT DOCUMENTS

| | | | |
|---|---|---|---|
| 9,947,412 B1 | 4/2018 | Hu | |
| 10,275,165 B2 * | 4/2019 | Inoue | ................... G06F 3/0656 |
| 2009/0040825 A1 | 2/2009 | Adusumilli et al. | |
| 2010/0205352 A1 | 8/2010 | Chu et al. | |
| 2013/0322169 A1 | 12/2013 | Goss et al. | |
| 2016/0266826 A1 | 9/2016 | Ooneda | |
| 2017/0017570 A1 | 1/2017 | Yeh et al. | |
| 2017/0185337 A1 | 6/2017 | Lee | |

(Continued)

FOREIGN PATENT DOCUMENTS

| | | |
|---|---|---|
| CN | 101464834 A | 6/2009 |
| CN | 101483067 A | 7/2009 |
| TW | 200915335 A | 4/2009 |

(Continued)

*Primary Examiner* — Xiaochun L Chen
(74) *Attorney, Agent, or Firm* — McClure, Qualey & Rodack, LLP

(57) ABSTRACT

Storage capacity optimization of non-volatile memory is shown. Through a controller, communication between a host and a non-volatile memory is in units of a first data length. The controller manages a bad column table for the non-volatile memory in units of a second data length. The second data length is shorter than the first data length. Taking byte communication as an example, one nibble of storage units is marked as bad when it has any damaged storage units.

16 Claims, 5 Drawing Sheets

(56) References Cited

U.S. PATENT DOCUMENTS

2018/0074730 A1\* 3/2018 Inoue .................... G06F 3/0638
2018/0121128 A1   5/2018 Doyle

FOREIGN PATENT DOCUMENTS

| TW | 201030521 A1 | 8/2010 |
| TW | 201702877 A  | 1/2017 |
| TW | 201724110 A  | 7/2017 |
| TW | I615711 B    | 2/2018 |

\* cited by examiner

| | | | | | | |
|---|---|---|---|---|---|---|
| Bad columns (according to table 208) | | | 302 | | 304 | |
| Data bus 216 | 1_L | 1_H | 2_L | 2_H | 3_L | 3_H |
| Output Bus 228 | 1_L | 1_H | 0xF | 2_L | 2_H | 0xF | 3_L | 3_H |

DATA STORAGE DEVICE AND CONTROL METHOD FOR NON-VOLATILE MEMORY

CROSS REFERENCE TO RELATED APPLICATIONS

This Application claims the benefit of U.S. Provisional Application No. 62/736,517, filed on Sep. 26, 2018, the entirety of which is incorporated by reference herein.

This Application also claims priority of Taiwan Patent Application No. 108112761, filed on Apr. 11, 2019, the entirety of which is incorporated by reference herein.

BACKGROUND OF THE INVENTION

Field of the Invention

The present invention relates to bad column management of a non-volatile memory.

Description of the Related Art

There are various forms of non-volatile memory (NVM) for long-term data storage, such as flash memory, magnetoresistive RAM, ferroelectric RAM, resistive RAM, spin transfer torque-RAM (STT-RAM), and so on. These non-volatile memories may be used as the storage medium in a data storage device.

Non-volatile memory may have some storage units that have been damaged by process instability, or that may be regarded as damaged due to frequent use. How to manage damaged storage units is an important issue in this technical field.

BRIEF SUMMARY OF THE INVENTION

In contrast to a first data length used for data transmission between a non-volatile memory and a host, the present invention uses a second data length to manage damaged storage units of a non-volatile memory. The second data length is shorter than the first data length. When storage units of the second data length have any damaged storage unit, the whole second data length is marked as bad columns. The present invention deliberately makes the bad column marking unit (the second data length) shorter than the data transmission unit (the first data length) to optimize the use of the non-volatile memory, reducing the probability of marking good storage units as bad columns.

A data storage device in accordance with an exemplary embodiment of the present invention has a non-volatile memory and a controller. The controller operates the non-volatile memory as requested by a host. The non-volatile memory and the host adopt a first data length as a data transmission unit. The controller manages a bad column table to record bad columns of the non-volatile memory, and uses a second data length as a management unit of the bad columns recorded in the bad column table. The second data length is shorter than the first data length. In an exemplary embodiment, storage units of the second data length within the non-volatile memory are marked as bad columns when having any damaged storage unit.

Based on the bad column table, the controller may insert dummy data into data loaded from a data bus. The controller writes data with inserted dummy data to the non-volatile memory to skip bad columns without affecting the data transmission unit of the non-volatile memory that is the first data length.

When inserting the dummy data, the controller may use a register to buffer data loaded from the data bus. After the dummy data is inserted, the controller outputs the data buffered in the register. The controller may further provide a bad column management module, a first multiplexer, and a second multiplexer. The first multiplexer has a first input terminal coupled to the data bus, and a second input terminal coupled to the register. The second multiplexer has a first input terminal receiving dummy data of the second data length, and a second input terminal coupled to an output terminal of the first multiplexer. The bad column management module controls the first multiplexer and the second multiplexer to insert dummy data into data loaded from the data bus.

The controller may further include a host data buffer, an error checking and correction engine and a metadata buffer. Data from the host data buffer, the error checking and correction engine and the metadata buffer is loaded to the data bus in turn.

The controller may classify data read from the non-volatile memory based on the bad column table. The controller individually buffers data of good columns to be separated from data of bad columns, and combines the buffered data of good columns to comply with the data transmission unit which is the first data length.

The controller may further include a bad column management module, a first first-in first-out buffer and a second first-in first-out buffer. The bad column management module operates according to the bad column table, to push data read from good columns to the first first-in first-out buffer and push data read from bad columns to the second first-in first-out buffer. The bad column management module combines data buffered in the same first-in first-out buffer to load data to a data bus in compliance with the first data length. The bad column management module may assert and deassert a dummy data flag based on the bad column table to indicate whether the data loaded to the data bus is dummy data.

The controller may further include a host data buffer, an error checking and correction engine and a metadata buffer. With dummy data skipped, data loaded to the data bus is transferred to the host data buffer, the error checking and correction engine and the metadata buffer in turn in response to the host.

The concept of the present invention may be also used to implement a non-volatile memory control method.

A non-volatile memory control method in accordance with an exemplary embodiment of the present invention includes the following steps: operating a non-volatile memory as requested by a host, wherein the non-volatile memory and the host adopt a first data length as a data transmission unit; and managing a bad column table to record bad columns of the non-volatile memory, wherein a second data length is adopted as a management unit of the bad columns recorded in the bad column table, wherein the second data length is shorter than the first data length.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 3A illustrates a write operation performed in accordance with the controller design of FIG. 2A.

DETAILED DESCRIPTION OF THE INVENTION

Figure 1:
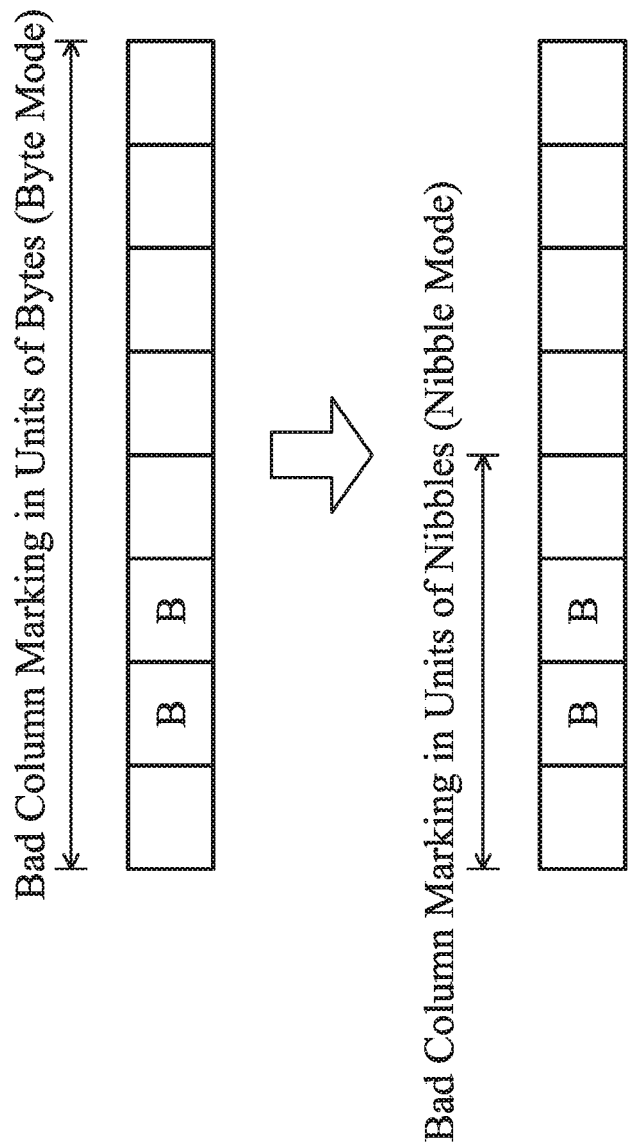
FIG. 1 compares the bad column marking in units of the first data length and in units of the second data length.

The following description shows exemplary embodiments of carrying out the invention. This description is made for the purpose of illustrating the general principles of the invention and should not be taken in a limiting sense. The scope of the invention is best determined by reference to the appended claims.

A non-volatile memory for long-term data retention may be a flash memory, a magnetoresistive RAM, a ferroelectric RAM, a resistive RAM, a spin transfer torque-RAM (STT-RAM) and so on. The following discussion uses flash memory as an example.

Today's data storage devices often use flash memory as the storage medium for storing user data from the host. There are many types of data storage devices, including memory cards, USB flash devices, SSDs, and so on. In another exemplary embodiment, a flash memory may be packaged with a controller to form a multiple-chip package called eMMC.

A data storage device using a flash memory as a storage medium can be applied in a variety of electronic devices, including a smartphone, a wearable device, a tablet computer, a virtual reality device, etc. A calculation module of an electronic device may be regarded as a host that operates a data storage device equipped on the electronic device to access a flash memory within the data storage device.

A data center may be built with data storage devices using flash memories as the storage medium. For example, a server may operate an array of SSDs to form a data center. The server may be regarded as a host that operates the SSDs to access the flash memories within the SSDs.

The memory controller of the data storage device may use multiple channels to access the flash memory (multi-channel accessing). The storage space of each channel may correspond to one or more chip enable signals (CE signals), to be accessed according to the assigned logical unit number (LUN).

Each logical unit number (LUN) may correspond to a plurality of planes. Each plane includes a plurality of blocks. Each block has a plurality of pages. Each page is provided to store data of preset data length (e.g., 4 KB, 8 KB, 16 KB, or the other). Host Data may be stored in units of 512 B or 4 KB. One page may store multiple units of host data. The flash memory may have damaged columns due to process instability. The available storage space of one page is typically greater than the preset data length. The damaged columns are replaced by the additional columns.

The memory controller may use a bad column table which marks bad columns of a flash memory. According to the bad column table, the memory controller avoids using bad columns to store data, or masks the bad columns. Eight columns may correspond to the storage of one byte of data. According to a conventional technique, bad column marking unit is set to a first data length (e.g. one byte). When any one of eight successive columns is damaged, the memory controller records in the bad column table that the all eight columns are bad columns.

In the present invention, the memory controller no longer uses the first data length as the unit of bad column marking. Instead, a second data length, such as 4 bits (also known as one nibble), is used as the unit of bad column marking. The second data length is shorter than the first data length. For one damaged column, the total number of data columns marked as bad columns is four rather than eight. When there is one damaged column in eight data columns, only four data columns are marked as bad columns in the bad column table while the other four data columns are still regarded as good columns. In this way, the data storage space of the flash memory is optimized. The bad column marking does not overly suppress the storage capability of the flash memory.

FIG. 1 compares the bad column marking in units of the first data length and in units of the second data length. In general, the data transmission unit between a flash memory and a memory controller is one byte. As shown, the damaged columns are indicated by symbols 'B'. There are two damaged columns in the 8 data columns. When marking bad columns in a byte mode (managing bad columns in units of a first data length), all 8 data columns are regarded as bad columns. There are six good columns being regarded as bad columns. The memory controller will skip and does not use the marked bad columns. When marking bad columns in a nibble mode (managing bad columns in units of a second data length), only the first 4 data columns are regarded as bad columns. The last 4 data columns are regarded as good columns for storage. The storage capacity of the flash memory, therefore, is optimized.

In an exemplary embodiment, the memory controller scans the flash memory during the card activation phase, and uses the second data length as the management unit for the bad column table. The bad column table preferably records the column address or column number of each bad column marking unit. In another exemplary embodiment, the bad column table lists the status of each bad column marking unit, which uses "1" and "0" to identify bad columns.

In an exemplary embodiment, the memory controller may update the bad column table in real time to add the newly damaged columns.

Because the bad column management is in units of a specific data length rather than the data transmission length, the memory controller needs to recombine the data read from the flash memory to get the valid data. As for data writing, data recombination is also necessary prior to writing data to the flash memory.

Figure 2A:
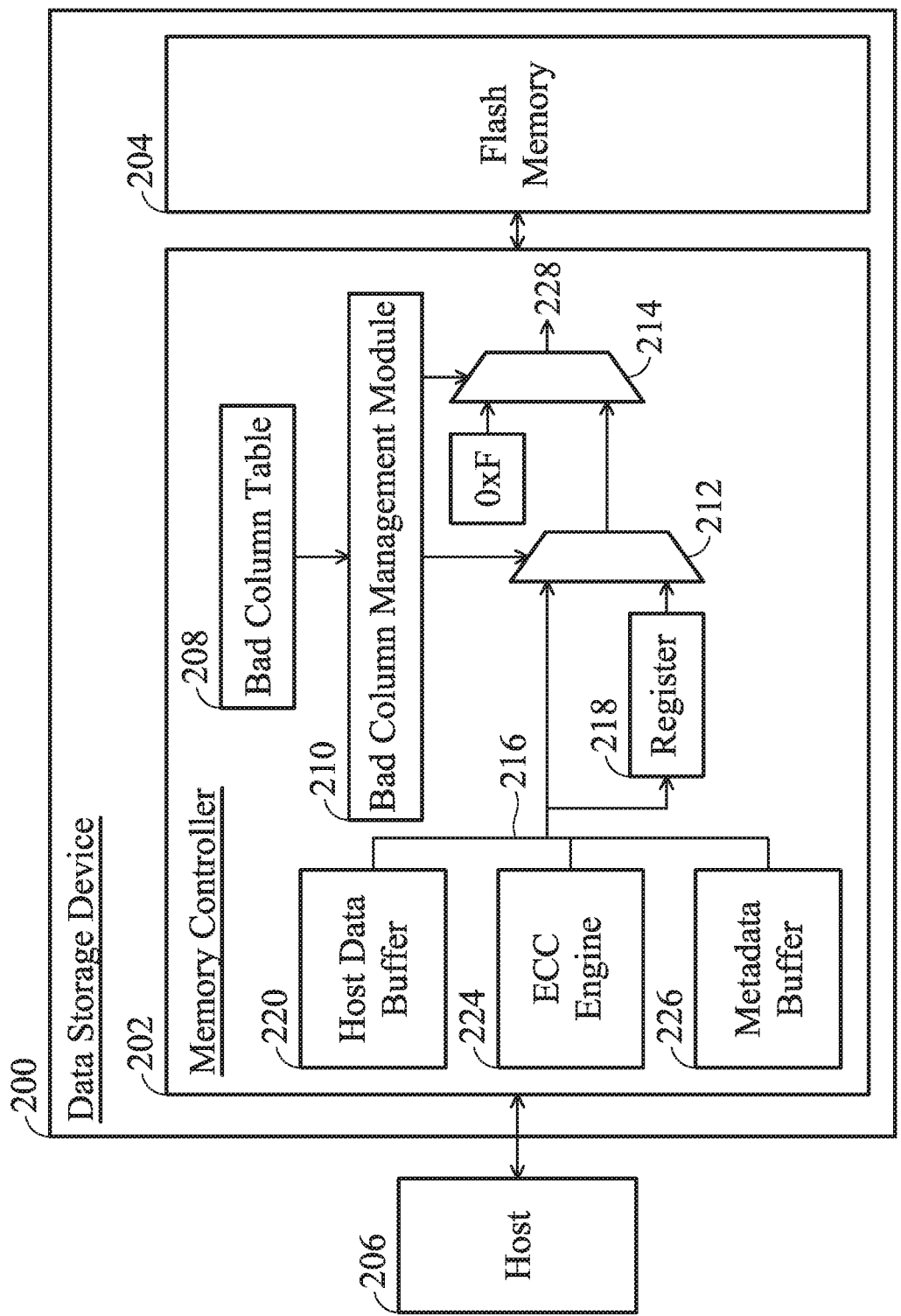
FIG. 2A illustrates a data storage device 200 in accordance with an exemplary embodiment of the present invention, wherein the corresponding design of memory controller 202 for programming the flash memory 204 is shown.

FIG. 2A illustrates a data storage device 200 in accordance with an exemplary embodiment of the present invention. The memory controller 202 may operate the flash memory 204 according to commands issued by the host 206.

The memory controller 202 establishes a bad column table 208 in which bad columns are managed in units of a specific data length that are shorter than the data transmission length. The bad column table 208 may be temporarily stored in a static random access memory (SRAM) or in another type of temporary storage device. In another exemplary embodiment, the bad column table 208 is stored in the flash memory 204. A bad column management module 210 is provided to control two multiplexers 212 and 214 according to the bad column table 208, and thereby nibbles of dummy data are inserted into data loaded from the data bus 216. Each nibble of dummy data may be 0xF. In this way, only good columns within the flash memory 204 are written with valid data. Bad columns of the flash memory 204 are skipped by dummy data.

Data transferred through the data bus 216 may be loaded from a host data buffer 220, an error checking and correction engine 224 and a metadata buffer 226. The host data buffer 220 is preferably a static random access memory (SRAM). Other temporary storage devices can also be used to buffer host data. The error checking and correction engine 224 may encode checking code from the host data. In an exemplary embodiment, the checking code may be generated for every 1 KB of host data. Host data may be checked or even corrected according to the checking code. In another exemplary embodiment, the host data buffer 220 is optional and the error checking and correction engine 224 directly receives the host data from the host 206. The metadata buffer 226 is used to temporarily store the metadata of one host data unit. In some exemplary embodiments, the size of metadata buffered in the metadata buffer 226 is one page.

The memory controller 202 may include a state machine, which loads the host data, checking code, and metadata to the data bus 216 in turn to be passed through the multiplexers 212 and 214 and output to the output bus 228. The data output by the output bus 228 is programmed to the flash memory 204 by the memory controller 202. As shown, a register 218 is provided for data buffering. When operating the multiplexer 214 to output the dummy data to the output bus 228, the memory controller 202 uses the register 218 to buffer the data loaded from the data bus 216. After the insertion of dummy data, the memory controller 202 passes the buffered data through the multiplexers 212 and 214 to output to the output bus 228. In this manner, dummy data insertion succeeds.

Figure 2B:
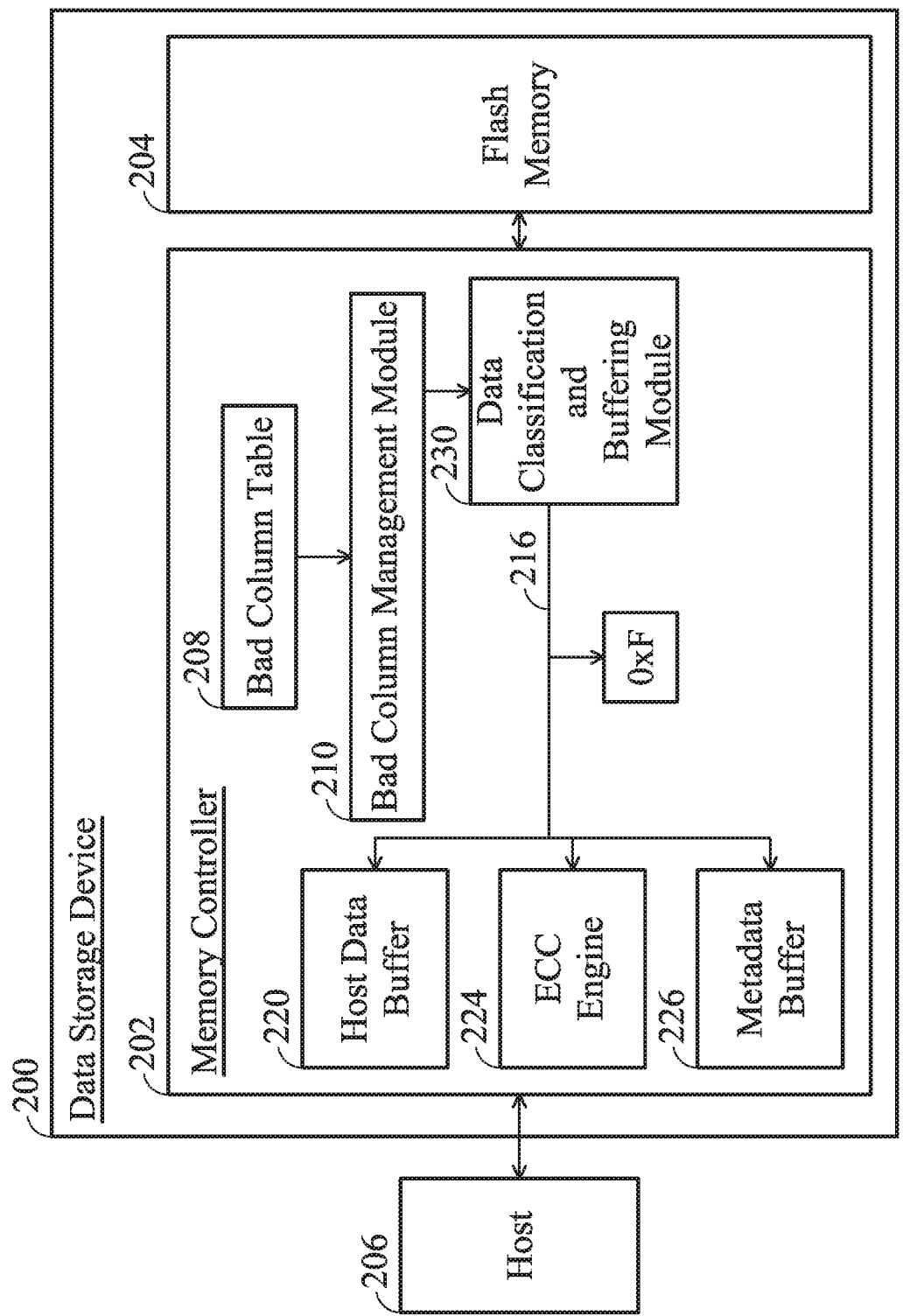
FIG. 2B illustrates a corresponding design of the memory controller 202 for the read operations of the flash memory 204 in accordance with an exemplary embodiment of the present invention.

FIG. 2B illustrates a corresponding design of the memory controller 202 for the read operations of the flash memory 204 in accordance with an exemplary embodiment of the present invention.

The memory controller 202 further includes a data classification and buffering module 230 constructed by logical units. According to the bad column table 208, the bad column management module 210 controls the data classification and buffering module 230 to classify the data read from the flash memory 204. Data read from bad columns is separated from data read from good columns. In an exemplary embodiment, two first-in first-out (FIFO) buffers are provided to separate the data read from bad columns and the data read from good columns. In another exemplary embodiment, only one buffer is used to buffer the data read from good columns and the data read from bad columns is abandoned. The buffers collect data byte by byte, and the buffered data is loaded to the data bus 216 byte by byte. No modifications are required on the other components of the memory controller 202. The byte mode transmission is workable even though the bad column management is in the nibble mode.

In an exemplary embodiment, the bad column management module 210 further uses a dummy data flag to indicate whether the data to be loaded to the data bus 216 is read from bad columns or good columns. After picking out the dummy data according to the dummy data flag, the state machine of the memory controller 202 may switch between states according to a byte count of the data read from good columns. According to the byte count, the state machine regards the data read from good columns as host data, checking code, or metadata, to be transferred to the host data buffer 220, the error checking and correction engine 224, or the metadata buffer 226.

The design of the memory controller 202 may have various variants. Regarding a write operation, the implementation includes: checking the bad column table 208 to insert dummy data into the data loaded from the data bus 216 and writing the data with inserted dummy data to the flash memory 204, so that the data written to the good columns is valid data while the bad columns are written with the dummy data. Specifically, the memory controller 202 and the flash memory 204 use the original communication specification (with data transmission in units of the first data length, longer than the second data length used in bad column management). Regarding a read operation, the implementation includes: operating the memory controller 202 to check the bad column table 208 and, accordingly, classify the data read from the flash memory 204. The memory controller 202 separates data read from good columns from data read from bad columns. By combining the data collected in the same buffer, correct read data is obtained. The memory controller 202 and the flash memory 204 still use the original communication specification (with data transmission in units of the first data length, longer than the second data length used in bad column management).

FIG. 3A illustrates a write operation performed in accordance with the controller design of FIG. 2A. In this example, each page has 4 bytes, and the bad column table 208 marks that the target page has bad columns 302 and bad columns 304. The data bus 216 sequentially transfers three bytes of data. Each byte can be divided into two nibbles. Two nibbles 1_L and 1_H form the first byte. Two nibbles 2_L and 2_H form the second byte. Two nibbles 3_L and 3_H form the third byte. When the data bus 216 transfers the two nibbles 1_L and 1_H, the bad column management module 210 directly passes the two nibbles 1_L and 1_H to the output bus 228. When the data bus 216 transfers the two nibbles 2_L and 2_H, the bad column management module 210 is aware of the bad columns 302 as recorded in the bad column table 208 and therefore inserts the four-bit dummy data 0xF prior to the nibble 2_L. The bad column management module 210 passes the dummy data 0xF and the nibble 2_L to the output bus 228 when buffering the nibble 2_H in the register 218. The bad column management module 210 then obtains the bad columns 304 as recorded in the bad column table 208 and inserts another four-bit dummy data 0xF prior to the nibble 2_H. After the bad column management module 210 passes the dummy data 0xF and the nibble 2_H to the output bus 228, the bad column management module 210 passes the final nibbles 3_L and the nibble 3_H to the output bus 228 without inserting any dummy data. As shown, the output bus 228 transfers four bytes, including the first byte formed by the two nibbles 1_L and 1_H, the second byte formed by 4-bit dummy data 0xF and one nibble 2_L, the third byte formed by 4-bit dummy data 0xF and one nibble 2_H, and the fourth byte formed by two nibbles 3_L and 3_H. The four bytes transferred through the output bus 228 are written to the target page of the flash memory 204. According to the present invention, the external communication of the flash memory 204 still uses the general design (e.g., transferring data in units of bytes). The bad columns of the specific length (e.g., one nibble) are skipped by the 4-bit dummy data 0xF. The 4-bit dummy data may be replaced by other values. Some modifications may be made on the logical circuit architecture that implements such a dummy data insertion.

Figure 3B:
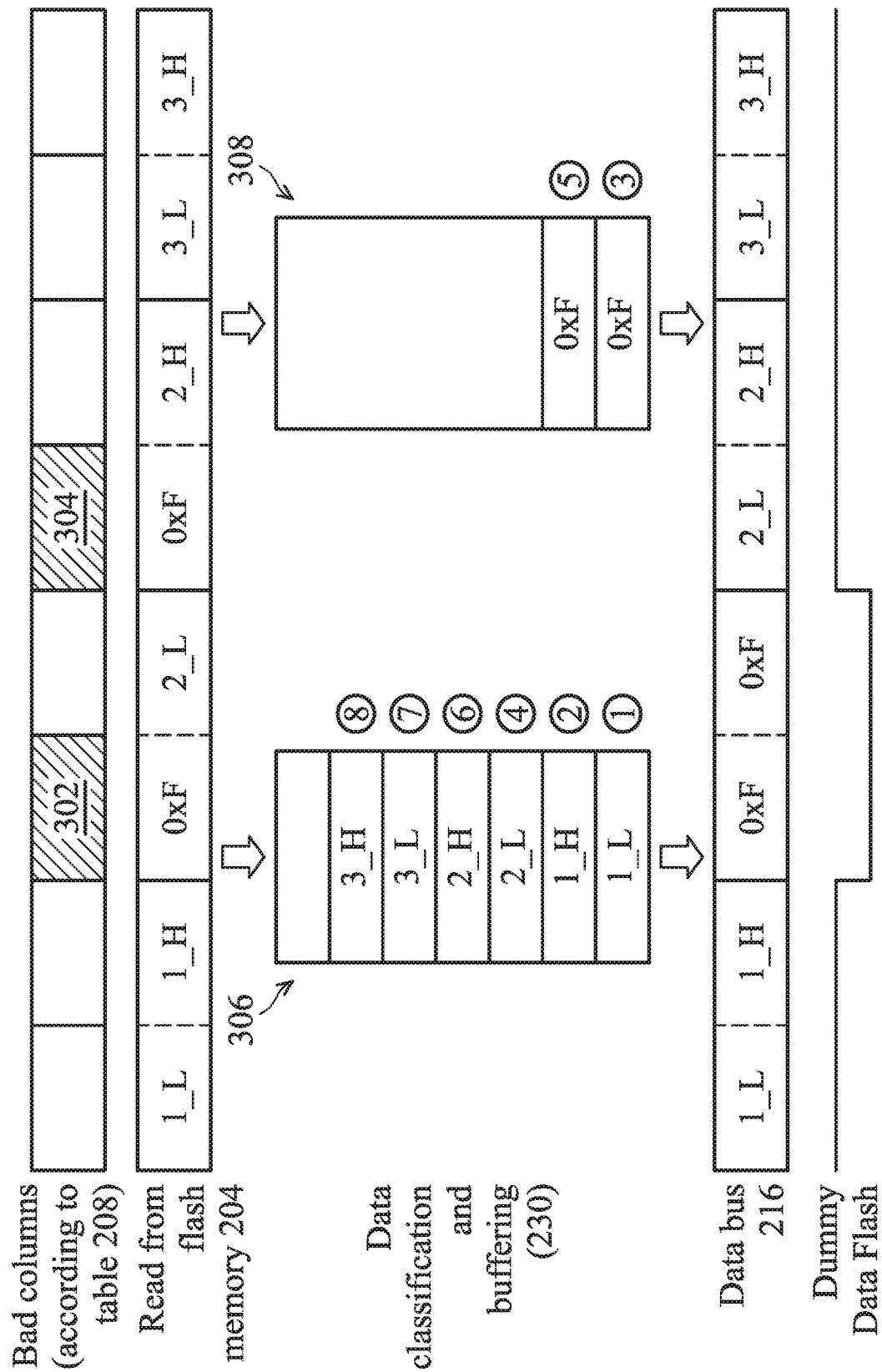
FIG. 3B illustrates a read operation performed in accordance with the controller design of FIG. 2B.

FIG. 3B illustrates a read operation performed in accordance with the controller design of FIG. 2B. According to a read request issued by the host 206, the memory controller 202 reads one page of the flash memory 204 to obtain four bytes, which are transferred back to the memory controller 202 through the output bus 228. Based on the bad column table 208, the data classification and buffering module 230 classifies the read data. 4-bit dummy data 0xF read from bad columns 302 and 304 and valid nibbles read from good columns are separately buffered. In the same buffer, bytes of data are recombined to be loaded to the data bus 216.

The order to fill the first-in first-out (FIFO) buffer 306 and the FIFO buffer 308 of the data classification and buffering module 230 is as follows: two nibbles 1_L and 1_H are buffered by the FIFO buffer 306 (labeled by timing numbers ①and ②); 4-bit of dummy data 0xF is buffered by the FIFO buffer 308 (labeled by timing number ③); one nibble 2_L is buffered by the FIFO buffer 306 (labeled by timing number ④); 4-bit dummy data 0xF is buffered by the FIFO buffer 308 (labeled by timing number ⑤); three nibbles 2_H, 3_L, and 3_H are buffered by the FIFO buffer 306 (labeled by timing numbers ⑥, ⑦ and ⑧). Referring to the timing numbers ① and ②, the two nibbles 1_L and 1_H are read from the FIFO buffer 306 to form the first byte of data to be loaded to the data bus 216. Referring to the timing numbers ③ and ④, the FIFO buffer 308 and the FIFO buffer 306 each have only one nibble of data. No pure valid byte or pure dummy byte can be formed. Referring to the timing number ⑤, one byte of dummy data has been collected in the FIFO buffer 308. The collected dummy byte, then, is loaded to the data bus 216 as the second byte. Referring to the timing number ⑥, one byte of valid data has been collected in the FIFO buffer 306. The collected valid byte, then, is loaded to the data bus 216 as the third byte. Referring to the timing numbers ⑦ and ⑧, two nibbles 3_L and 3_H forming the forth byte are read from the FIFO buffer 306 to be loaded to the data bus 216. The data bus 216 conforms to the data length (in units of bytes) used in the communication interface.

The bad column management module 210 may further assert/deassert a dummy data flag 310 according to the bad column table 208, to show whether the data loaded to the data bus 216 is valid data or dummy data. As shown, the asserted flag indicates the valid and the deasserted flag indicates the dummy data.

The foregoing concept of the present invention can be further applied to a method for controlling a non-volatile memory.

A non-volatile memory control method in accordance with an exemplary embodiment of the present invention includes the following steps: step S12, receiving a command from a host, wherein the command may be a read command or a write command; and step S14, accessing the non-volatile memory in response to the command based on a bad column table. The non-volatile memory adopts a first data length as the data transmission unit. The command data, however, is managed in units of a second data length. The second data length is less than the first data length.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a non-volatile memory; and
a controller, operating the non-volatile memory as requested by a host,
wherein:
the non-volatile memory and the host adopt a first data length as a data transmission unit;
the controller manages a bad column table to record bad columns of the non-volatile memory, and uses a second data length as a management unit of the bad columns recorded in the bad column table;
the second data length is shorter than the first data length;
storage units of the second data length within the non-volatile memory are marked as bad columns when having any damaged storage unit; and
the controller classifies data read from the non-volatile memory based on the bad column table, individually buffers data of good columns to be separated from data of bad columns, and combines the buffered data of good columns to comply with the data transmission unit which is the first data length.

2. The data storage device as claimed in claim 1, wherein:
the controller inserts dummy data into data loaded from a data bus based on the bad column table, and writes data with inserted dummy data to the non-volatile memory to skip bad columns without affecting the data transmission unit of the non-volatile memory that is the first data length.

3. The data storage device as claimed in claim 2, wherein:
when inserting the dummy data, the controller uses a register to buffer data loaded from the data bus; and
after the dummy data is inserted, the controller outputs the data buffered in the register.

4. The data storage device as claimed in claim 3, wherein:
the controller further provides a bad column management module, a first multiplexer, and a second multiplexer;
the first multiplexer has a first input terminal coupled to the data bus, and a second input terminal coupled to the register;
the second multiplexer has a first input terminal receiving dummy data of the second data length, and a second input terminal coupled to an output terminal of the first multiplexer; and
the bad column management module controls the first multiplexer and the second multiplexer to insert dummy data into data loaded from the data bus.

5. The data storage device as claimed in claim 4, wherein:
the controller further includes a host data buffer, an error checking and correction engine and a metadata buffer; and
data from the host data buffer, the error checking and correction engine and the metadata buffer is loaded to the data bus in turn.

6. The data storage device as claimed in claim 1, wherein:
the controller further includes a bad column management module, a first first-in first-out buffer and a second first-in first-out buffer;
the bad column management module operates according to the bad column table, to push data read from good columns to the first first-in first-out buffer and push data read from bad columns to the second first-in first-out buffer; and
the bad column management module combines data buffered in the same first-in first-out buffer to load data to a data bus in compliance with the first data length.

7. The data storage device as claimed in claim 6, wherein:
the bad column management module asserts and deasserts a dummy data flag based on the bad column table to indicate whether the data loaded to the data bus is dummy data.

8. The data storage device as claimed in claim 7, wherein:
the controller further includes a host data buffer, an error checking and correction engine and a metadata buffer; and with dummy data skipped, data loaded to the data bus is transferred to the host data buffer, the error checking and correction engine and the metadata buffer in turn in response to the host.

9. A non-volatile memory control method, comprising:
operating a non-volatile memory as requested by a host, wherein the non-volatile memory and the host adopt a first data length as a data transmission unit;

managing a bad column table to record bad columns of the non-volatile memory, wherein a second data length is adopted as a management unit of the bad columns recorded in the bad column table, wherein the second data length is shorter than the first data length, and storage units of the second data length within the non-volatile memory are marked as bad columns when having any damaged storage unit;

classifying data read from the non-volatile memory based on the bad column table and individually buffering data of good columns to be separated from data of bad columns; and combining the buffered data of good columns to comply with the data transmission unit which is the first data length.

10. The non-volatile memory control method as claimed in claim 9, further comprising:
inserting dummy data into data loaded from a data bus based on the bad column table; and writing data with inserted dummy data to the non-volatile memory to skip bad columns without affecting the data transmission unit of the non-volatile memory that is the first data length.

11. The non-volatile memory control method as claimed in claim 10, further comprising:
using a register to buffer data loaded from the data bus when inserting the dummy data; and after the dummy data is inserted, outputting the data buffered in the register.

12. The non-volatile memory control method as claimed in claim 11, further comprising:
providing a bad column management module, a first multiplexer, and a second multiplexer, wherein:
the first multiplexer has a first input terminal coupled to the data bus, and a second input terminal coupled to the register;

the second multiplexer has a first input terminal receiving dummy data of the second data length, and a second input terminal coupled to an output terminal of the first multiplexer; and the bad column management module controls the first multiplexer and the second multiplexer to insert dummy data into data loaded from the data bus.

13. The non-volatile memory control method as claimed in claim 12, further comprising:
providing a host data buffer, an error checking and correction engine and a metadata buffer, wherein:
data from the host data buffer, the error checking and correction engine and the metadata buffer is loaded to the data bus in turn.

14. The non-volatile memory control method as claimed in claim 9, further comprising:
providing a bad column management module, a first first-in first-out buffer and a second first-in first-out buffer, wherein:
the bad column management module operates according to the bad column table, to push data read from good columns to the first first-in first-out buffer and push data read from bad columns to the second first-in first-out buffer; and the bad column management module combines data buffered in the same first-in first-out buffer to load data to a data bus in compliance with the first data length.

15. The non-volatile memory control method as claimed in claim 14, wherein:
the bad column management module asserts and deasserts a dummy data flag based on the bad column table to indicate whether the data loaded to the data bus is dummy data.

16. The non-volatile memory control method as claimed in claim 15, further comprising:
providing a host data buffer, an error checking and correction engine and a metadata buffer, wherein:
with dummy data skipped, data loaded to the data bus is transferred to the host data buffer, the error checking and correction engine and the metadata buffer in turn in response to the host.

* * * * *